(12) United States Patent
Mantani et al.

(10) Patent No.: US 9,338,892 B2
(45) Date of Patent: May 10, 2016

(54) SCREEN PRINTER AND COMPONENT MOUNTING LINE

(71) Applicant: PANASONIC INTELLECTUAL PROPERTY MANAGEMENT CO., LTD., Osaka (JP)

(72) Inventors: Masayuki Mantani, Yamanashi (JP); Mitsuru Kouchi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/546,130

(22) Filed: Nov. 18, 2014

(65) Prior Publication Data
US 2015/0136326 A1 May 21, 2015

(30) Foreign Application Priority Data
Nov. 18, 2013 (JP) ................. 2013-237623

(51) Int. Cl.
*B41F 15/16* (2006.01)
*B41F 15/26* (2006.01)
*H05K 3/12* (2006.01)
*B41F 15/08* (2006.01)
*H05K 3/34* (2006.01)

(52) U.S. Cl.
CPC .......... *H05K 3/1233* (2013.01); *B41F 15/0813* (2013.01); *B41F 15/16* (2013.01); *B41F 15/26* (2013.01); *H05K 3/3484* (2013.01)

(58) Field of Classification Search
CPC .. B41F 15/08; B41F 15/0813; B41F 15/0881; B41F 15/14; B41F 15/16; B41F 15/26; B41M 1/12; H05K 3/1216; H05K 3/1233; H05K 3/3484
USPC ........................................... 101/126
See application file for complete search history.

(56) References Cited

U.S. PATENT DOCUMENTS 6,129,014 A * 10/2000 Tani .................. B41F 15/16
101/126
7,142,939 B2   11/2006 Nonaka et al.
(Continued)

FOREIGN PATENT DOCUMENTS

| JP | 07-214748 A | 8/1995 |
| JP | 2000108301 A * | 4/2000 |
| JP | 2004-185631 A | 7/2004 |

(Continued)

OTHER PUBLICATIONS
Japanese Office Action dated Feb. 23, 2016 for JP-2016-237623.

*Primary Examiner* — Leslie J Evanisko
(74) *Attorney, Agent, or Firm* — Pearne & Gordon LLP

(57) ABSTRACT

A screen printer includes: a mask with a pattern hole; a substrate holder that clamps and holds a substrate at sides of the substrate by a pair of clamping members below the mask; a substrate holder elevation mechanism that moves the substrate holder up and down to contact the substrate with a lower surface of the mask; a paste filling unit that fills the pattern hole with a paste; a mask contact member that is provided in the clamp member and that contacts with the mask in a state in which the substrate contacts with the mask; and an urging portion that is provided in the clamp member and that includes an urging unit that urges the mask contact member upward.

6 Claims, 14 Drawing Sheets

(56) References Cited

U.S. PATENT DOCUMENTS

| | | |
|---|---|---|
| 7,281,472 B2 | 10/2007 | Sakaue et al. |
| 2004/0153868 A1 | 8/2004 | Nonaka et al. |
| 2005/0252395 A1 | 11/2005 | Sakaue et al. |

FOREIGN PATENT DOCUMENTS

| | | | |
|---|---|---|---|
| JP | 2005-324493 A | | 11/2005 |
| JP | 2006272583 A | * | 10/2006 |
| JP | 2009-066762 A | | 9/2007 |

* cited by examiner

SCREEN PRINTER AND COMPONENT MOUNTING LINE

CROSS REFERENCE TO RELATED APPLICATION(S)

The present disclosure relates to the subject matters contained in Japanese Patent Application No. 2013-237623 filed on Nov. 18, 2013, which are incorporated herein by reference in its entirety.

FIELD

One or more embodiments of the present invention relate to a screen printer which prints a paste on a substrate via pattern holes of a mask and a component mounting line configured to include the screen printer.

BACKGROUND

A component mounting line is provided with a screen printer which prints a paste such as solder on a substrate and a component mounting machine which mounts a component on the substrate on which the paste is printed by the screen printer. In the screen printer of such a component mounting line, a substrate clamped at the sides thereof by a pair of clamping members is brought into contact with a lower surface of a mask having pattern holes formed thereon, a squeegee is slid on the mask contacting with the substrate to fill the pattern holes of the mask with the paste, and then the substrate is moved in a direction away from the mask to perform plate releasing.

In such a screen printer, the thickness of a mask has been reduced owing to formation of a fine printing pattern associated with formation of a fine-pitch substrate in recent years. When the thickness of the mask is reduced as described above, the mask brought into close contact with a substrate upon filling of a paste by a squeegee is pulled toward the substrate in the subsequent plate releasing and a central portion of the mask is thus bent downward. Thus, directions of plate separation in end portions of the substrate may not be perpendicular to the substrate, and thus shapes of the paste after printing may collapse and printing accuracy may be deteriorated. Therefore, a technique has been known in which a suction mechanism which vacuum-sucks a substrate to a lower receiving portion which supports the substrate from below is provided, and in plate releasing, without moving down a clamping mechanism, only the lower receiving portion vacuum-sucking the substrate is moved down so that a mask is not pulled toward the substrate and not bent downward in the plate releasing (see Patent Document 1, for instance).

Patent Document 1 is JP-A-H7-214748.

SUMMARY

However, in the above-described related-art configuration, as devices for sucking the substrate, a vacuum pump, a member for a pipe and the like are needed, and the configuration may become complicated and the cost may be increased.

One object of the embodiments of the invention is to provide a screen printer and a component mounting line which are capable of securing good printing accuracy by smoothly performing plate separation and are advantageous in cost.

A screen printer according to the embodiments includes: a mask on which a pattern hole is formed; a substrate holder that clamps and holds a substrate at sides of the substrate by a pair of clamping members below the mask; a substrate holder elevation mechanism that moves the substrate holder holding the substrate up and down to contact the substrate with a lower surface of the mask; a paste filling unit that fills, with a paste, the pattern hole of the mask that is contacted with the substrate by the substrate holder elevation mechanism; a mask contact member that is provided in the clamp member and that contacts with the mask in a state in which the substrate contacts with the mask; and an urging portion that is provided in the clamp member and that includes an urging unit that urges the mask contact member upward, wherein, after the pattern hole of the mask is filled with the paste, the substrate holder elevation mechanism moves the substrate in a direction away from the mask to perform plate releasing with the urging portion urging the mask contact member upward.

A component mounting line according to the embodiments includes: the screen printer according to the embodiments; and a component mounting machine that mounts a component on the substrate on which the paste is printed by the screen printer.

According to the embodiments, plate separation smoothly performed, and thus good printing accuracy can be secured and there is an advantage in cost.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS (First Embodiment)

Figure 1:
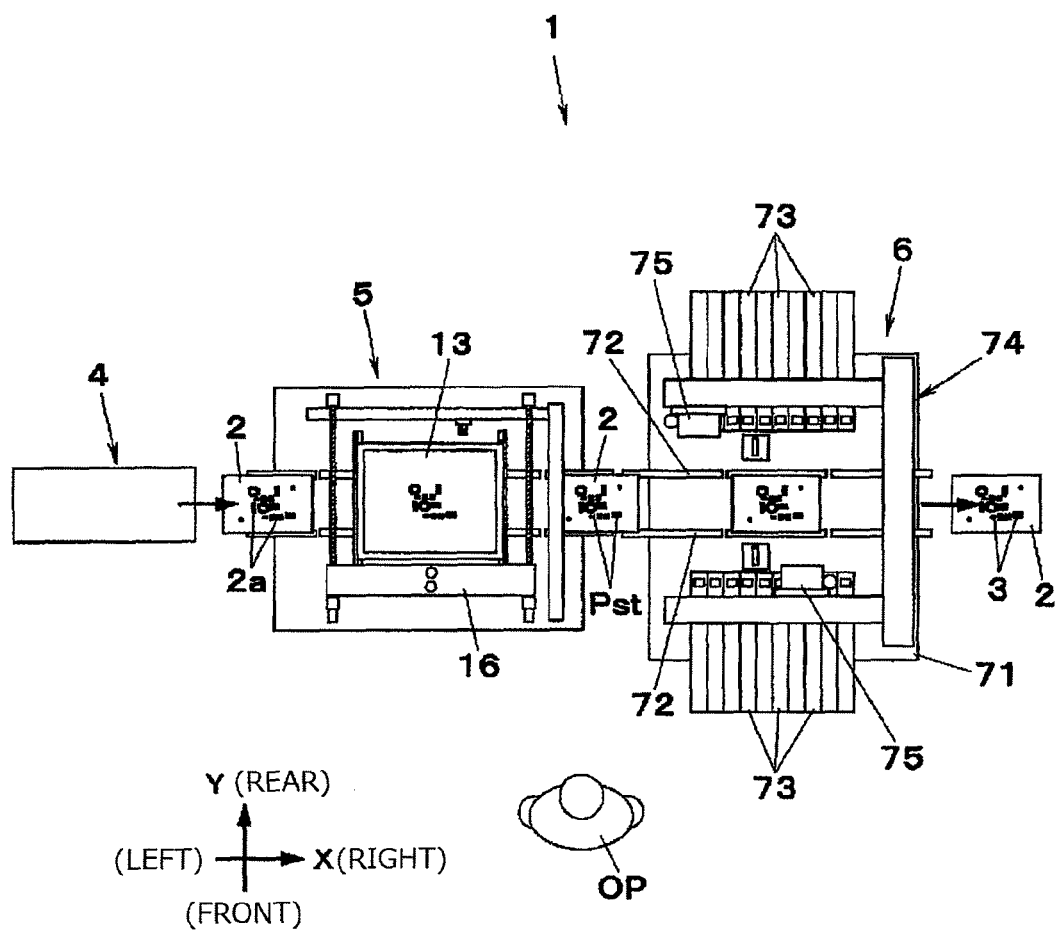
FIG. 1 is a schematic diagram showing a configuration of a component mounting line of a first embodiment of the invention.

FIG. 1 shows a component mounting line 1 of a first embodiment of the invention. The component mounting line 1 is provided to manufacture a component mounting substrate by mounting a component 3 on a substrate 2, and is configured to include a screen printer 5 which performs screen printing with a paste Pst such as solder on electrodes 2a of the substrate 2 supplied from a substrate supply portion 4, and a component mounting machine 6 which mounts the component 3 on the substrate 2 on which the paste Pst is printed using the screen printer 5. In this embodiment, a direction in which the substrate 2 flows in the component mounting line 1 is a horizontal in-plane direction (a longitudinal direction viewed from an operator OP) from the left side toward the right side in FIG. 1, and is called an X-axis direction. A horizontal in-plane direction (a front-back direction viewed from the operator OP) perpendicular to the X-axis direction is called a Y-axis direction, and a vertical direction is called a Z-axis direction. In this embodiment, the left side of the sheet of FIG. 1 corresponds to the upstream side of the flow of the substrate 2 (upstream process side), and the right side of the sheet of FIG. 1 corresponds to the downstream side of the flow of the substrate 2 (downstream process side).

Figure 2:
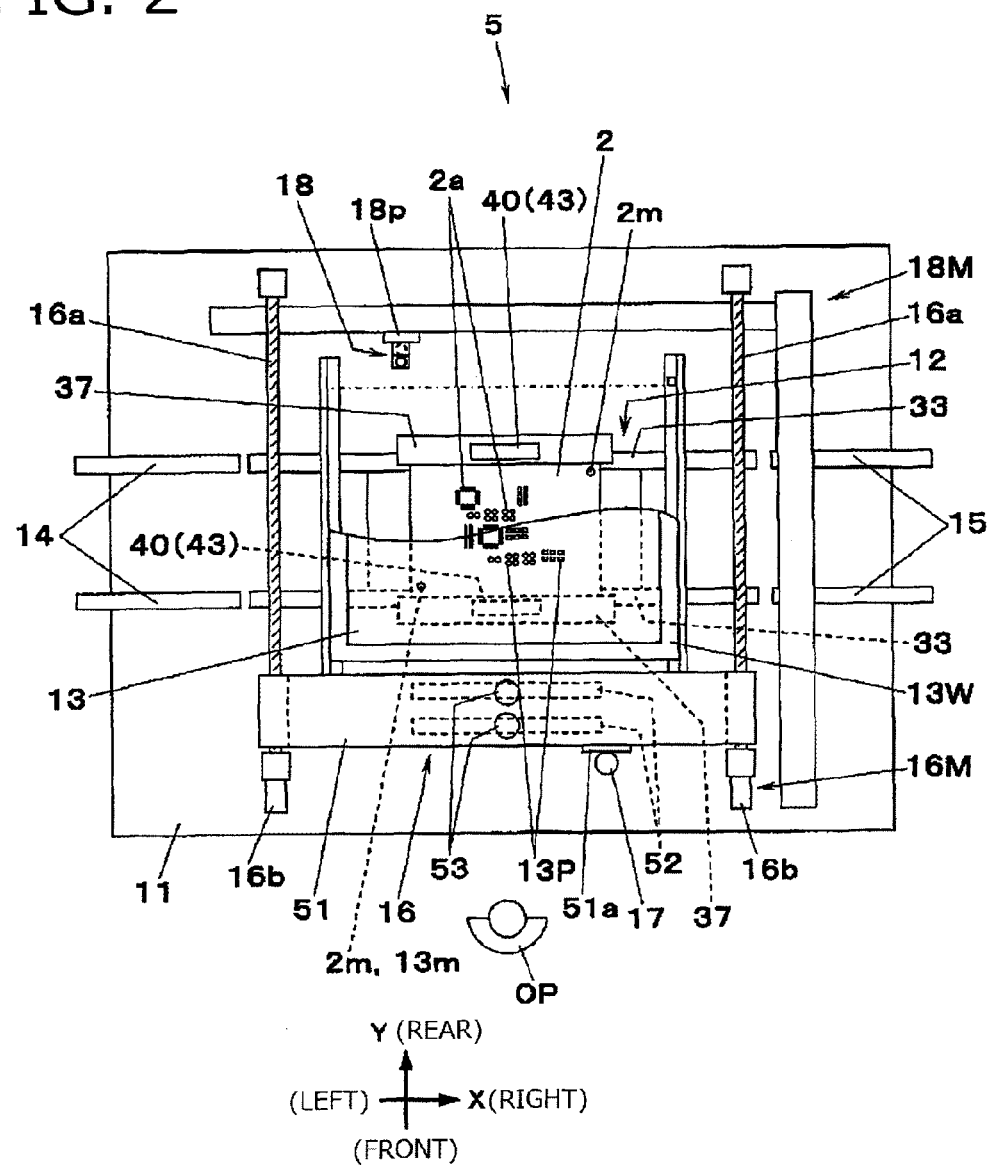
FIG. 2 is a plan view of a screen printer constituting the component mounting line of the first embodiment of the invention.
Figure 3:
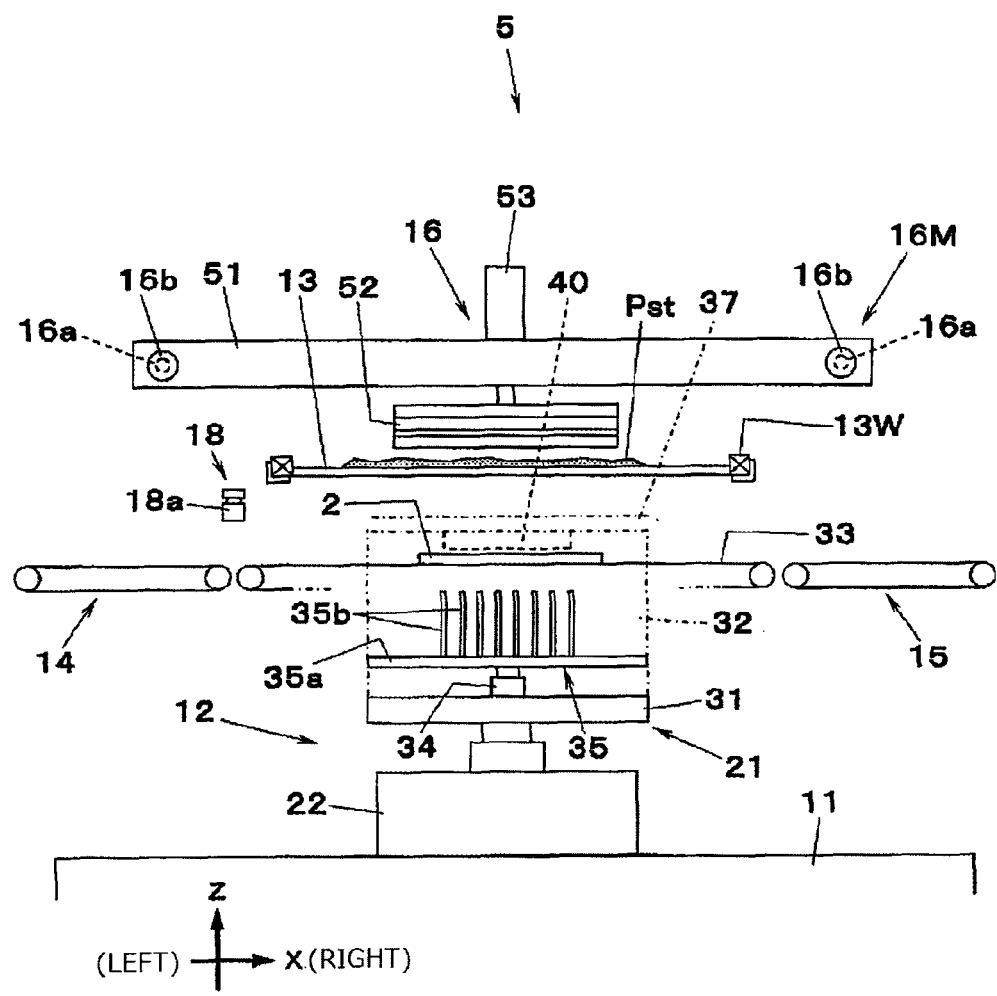
FIG. 3 is a front view of the screen printer of the first embodiment of the invention.
Figure 4:
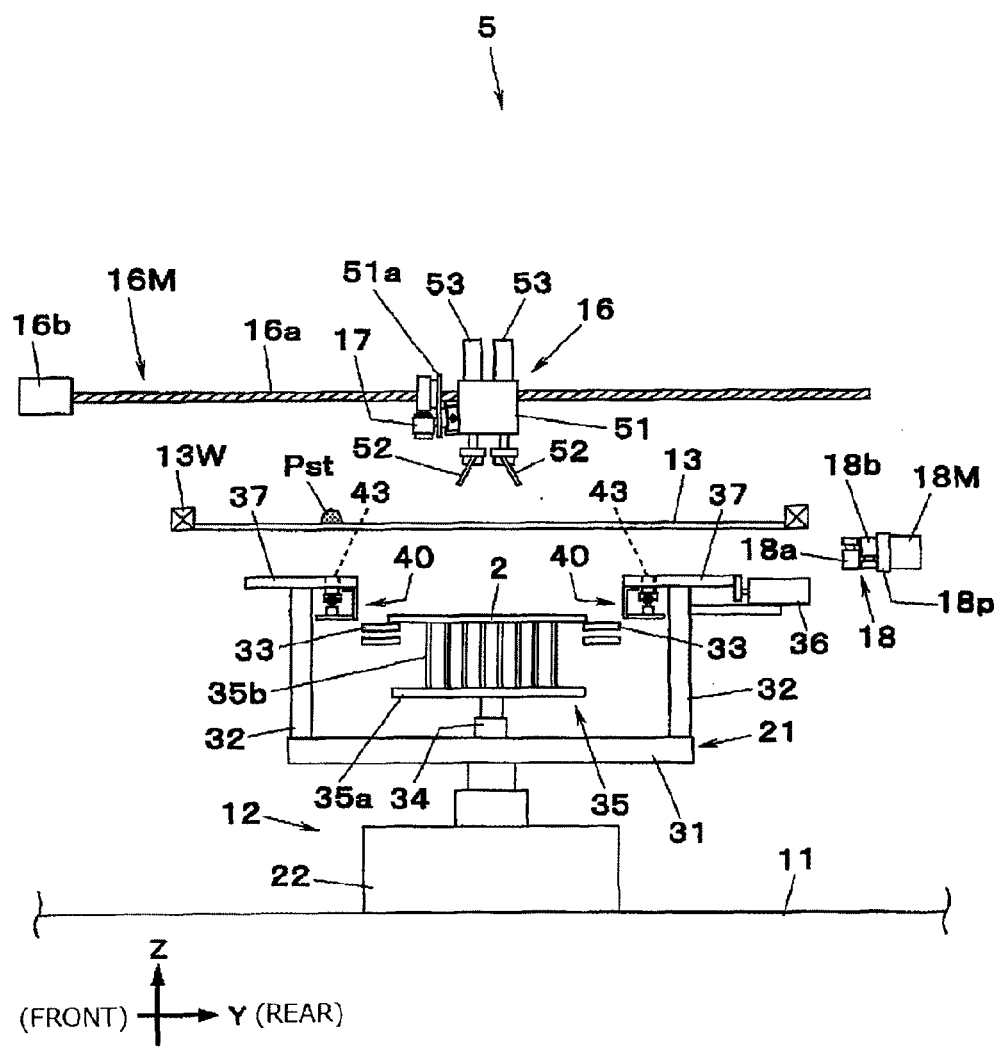
FIG. 4 is a side view of the screen printer of the first embodiment of the invention.

In FIGS. 2, 3, and 4, the screen printer 5 is provided with a substrate holding and moving mechanism 12 on a base 11, and a mask 13 is installed above the substrate holding and moving mechanism 12. On the upstream side of the flow of the substrate 2 of the substrate holding and moving mechanism 12 on the base 11 (on the left sides of the sheets of FIGS. 2 and 3), a feeding conveyor 14 as a substrate feeding portion which transfers the substrate 2 fed from another device (here, the substrate supply portion 4) on the upstream process side to the substrate holding and moving mechanism 12 is provided, and on the downstream side of the flow of the substrate 2 of the substrate holding and moving mechanism 12 on the base 11 (on the right sides of the sheets of FIGS. 2 and 3), a discharge conveyor 15 as a substrate discharge portion which receives the substrate 2 sent from the substrate holding and moving mechanism 12 and discharges the substrate 2 to another device (here, the component mounting machine 6) on the downstream process side is provided. The screen printer 5 is provided with, above the mask 13, a printing head 16 which is moved by a printing head moving mechanism 16SI and a paste supply syringe 17 which is provided integrally with the printing head 16, and is provided with, below the mask 13, a camera unit 18 as imaging means which is moved in the horizontal plane by a camera unit moving mechanism 18M.

In FIGS. 3 and 4, the substrate holding and moving mechanism 12 is formed of a substrate holding unit 21 which holds the substrate 2 and a substrate holding unit moving mechanism 22 which moves the substrate holding unit 21 in the horizontal in-plane direction (in the X-Y plane) and in the vertical (Z-axis) direction. The substrate holding unit 21 is provided with an elevation plate 31 which becomes a base, a pair of front and rear conveyor support members 32 extending upward from the elevation plate 31, a pair of front and rear conveyors 33 (also see FIG. 2) which are attached to the conveyor support members 32, a lower receiving portion 35 which is moved up and down above the elevation plate 31 by an elevation actuator 34 attached to the elevation plate 31, and a pair of front and rear clamping members 37 (also see FIG. 2) which are provided above the conveyors 33 and are opened or closed by a clamping member drive motor 36 in the Y-axis direction.

In FIGS. 3 and 4, the lower receiving portion 35 is formed of a base table 35a which is moved up and down by the elevation actuator 34 and a plurality of lower receiving pins 35b which are provided to extend upward from an upper surface of the base table 35a. The base table 35a of the lower receiving portion 35 reaches a height of H1 at a first position where the substrate holding unit moving mechanism 22 does not push the substrate holding unit 21 upward and the elevation actuator 34 does not also push the lower receiving portion 35 upward (FIG. 5A), reaches a height of H2 at a second position where the substrate holding unit moving mechanism 22 does not push the substrate holding unit 21 upward and the elevation actuator 34 pushes the lower receiving portion 35 upward (FIG. 5B), and reaches a height of H3 at a third position where the substrate holding unit moving mechanism 22 pushes the substrate holding unit 21 upward in a state in which the elevation actuator 34 pushes the lower receiving portion 35 upward (FIG. 5C). FIGS. 3 and 4 show a state in which the base table 35a is positioned at the first position.

In FIG. 2, the mask 13 has a rectangular flat plate shape extending in the X-Y plane, and an outer circumference thereof is supported by a frame member 13W. The mask 13 has pattern holes 13P formed in an arrangement corresponding to the arrangement of the electrodes 2a of the substrate 2. A pair of substrate-side marks 2m are provided at a diagonal position of the substrate 2, and a pair of mask-side marks 13m are provided corresponding to the substrate-side marks 2m on the mask 13.

Figure 6:
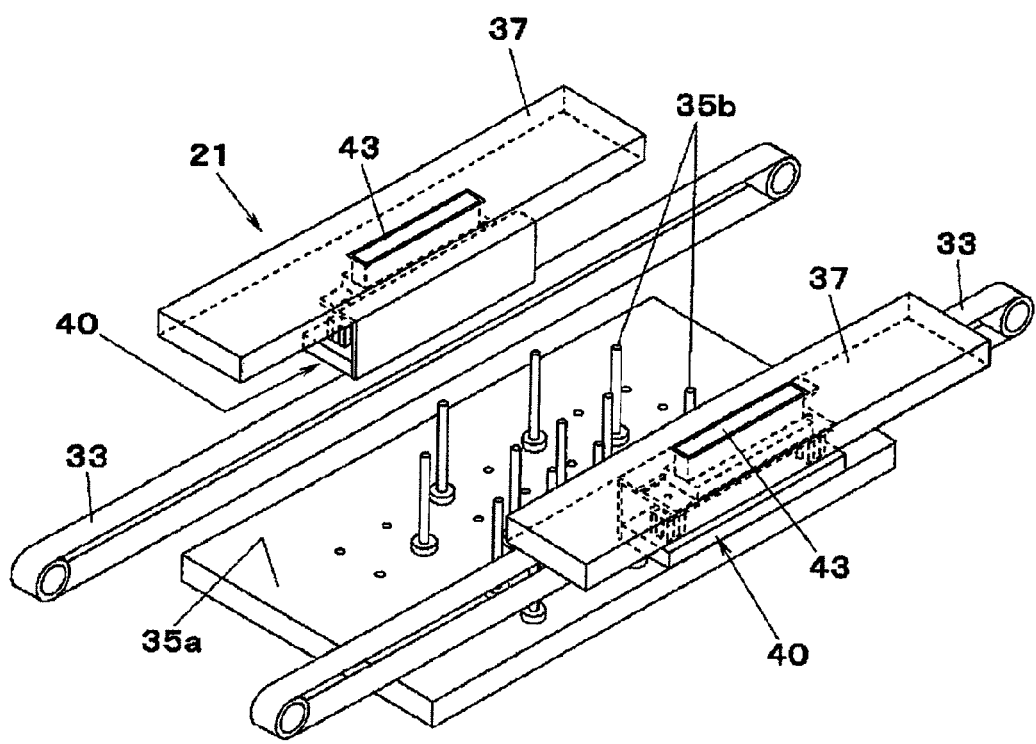
FIG. 6 is a perspective view of a substrate holding unit of the screen printer of the first embodiment of the invention.
Figure 6:
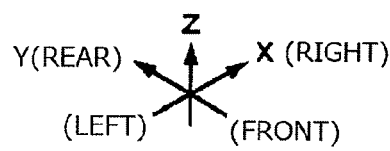
Figure 7:
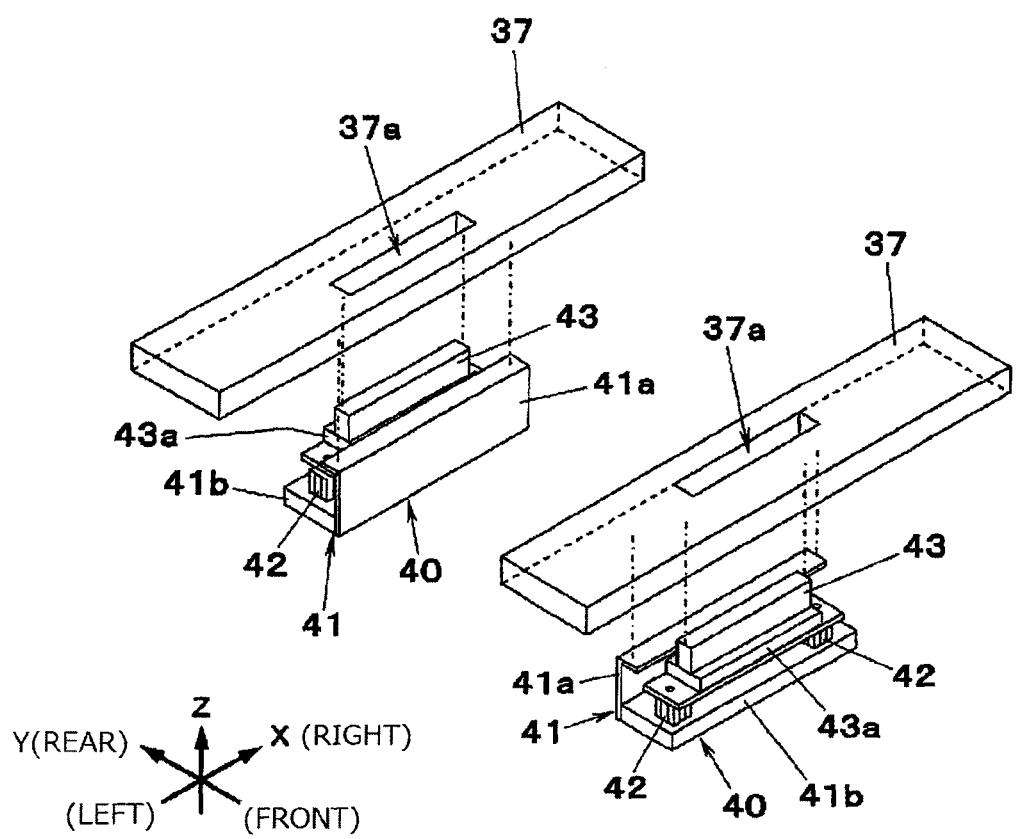
FIG. 7 is a partial exploded perspective view of the substrate holding unit of the first embodiment of the invention.
Figure 8A:
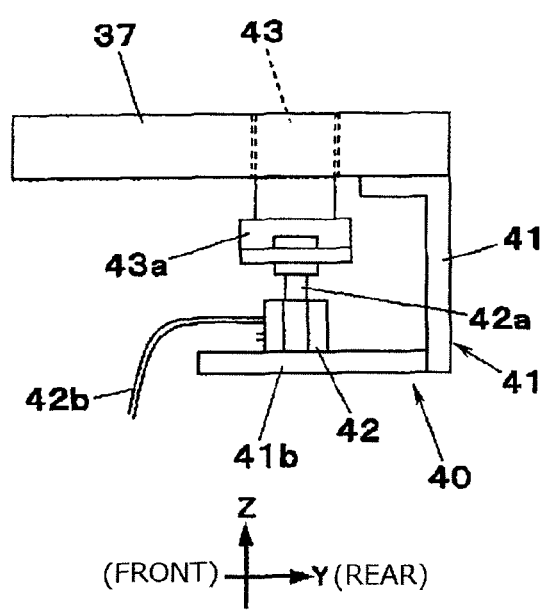
FIGS. 8A and 8B are side views of an urging portion of the substrate holding unit of the first embodiment of the invention.
Figure 8B:
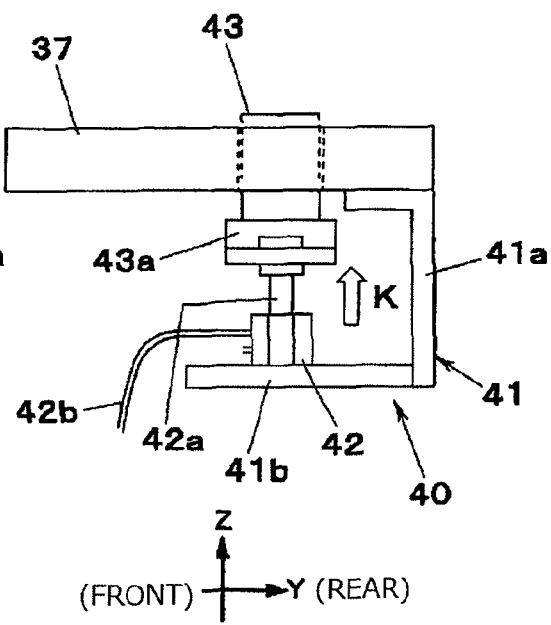

In FIG. 6, each clamping member 37 is provided with an urging portion 40. As shown in FIGS. 7, 8A, and 8B, the urging portion 40 is formed of an L-shaped bracket 41 which has a vertical portion 41a attached to a lower surface of each clamping member 37 and extending downward and a horizontal portion 41b extending horizontally from a lower end of the vertical portion 41a, two cylinders (pneumatic cylinders) 42 which are provided with piston rods 42a facing upward on the horizontal portion 41b of the bracket 41, and a block-shaped mask contact member 43 of which both end portions in the X-axis direction are supported by the piston rods 42a of the two cylinders 42. The clamping member 37 is provided with a rectangular vertical through hole 37a having such dimensions as to be one size larger than the rectangular outer shape of the mask contact member 43, and the urging portion 40 is attached to the clamping member 37 in a state in which the mask contact member 43 is fitted in the vertical through hole 37a of the clamping member 37 from below. A lower portion of the mask contact member 43 is provided with a stopper 43a having an outer shape larger than an inner shape of the vertical through hole 37a of the clamping member 37 to prevent the mask contact member 43 from being disengaged upward from the vertical through hole 37a.

In FIGS. 8A and 8B, the cylinder 42 of each urging portion 40 is operated (the piston rod 42a is moved up and down) when compressed air is supplied to a compressed air supply pipe line 42b connected to the cylinder 42, and when the mask contact member 43 is moved up and down, the two cylinders 42 are operated in synchronization with each other. In a state in which no compressed air is supplied to the two cylinders 42, the mask contact member 43 is positioned at an initial position where the height of an upper surface of the mask contact member 43 and the height of an upper surface of the clamping member 37 are approximately the same (FIG. 8A). When compressed air is supplied to the two cylinders 42, the mask contact member 43 is moved up from the initial position (the arrow K shown in FIG. 8B), and protrudes upward from the clamping member 37 by an amount corresponding to the magnitude of the pressure of the compressed air which is being supplied (FIG. 8B).

Figure 5A:
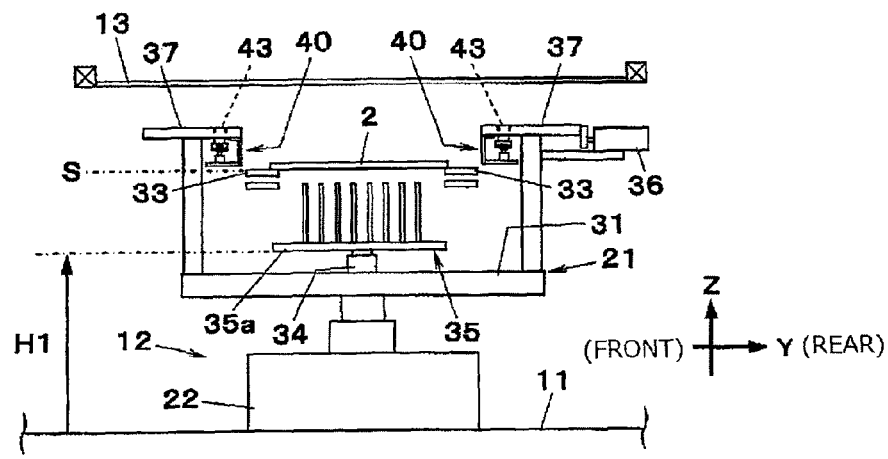
FIGS. 5A, 5B, and 5C are diagrams illustrating operations of the screen printer of the first embodiment of the invention.

In FIG. 5A, in a state in which the base table 35a is positioned at the above-described first position (a height of H1), an upper end of the lower receiving pin 35b of the lower receiving portion 35 is positioned lower than a transport surface S of the substrate 2 transported by the conveyors 33. In such a state, the conveyors 33 receive the substrate 2 from the feeding conveyor 14 and transport the received substrate 2 in the X-axis direction to position the substrate 2 at a predetermined clamping position (FIG. 5A). When the conveyors 33 position the substrate 2 at the clamping position, the elevation actuator 34 pushes the lower receiving portion 35 upward (the arrow A shown in FIG. 5S), and the lower receiving portion 35 lifts the substrate 2 in a state of supporting (receiving from below) the substrate 2 to separate the substrate 2 from the conveyors 33. When the elevation actuator 34 pushes the base table 35a upward up to the second position (a height of H2) (FIG. 5S), the clamping members 37 clamp the substrate 2 at the sides (in the Y-axis direction) (the arrow B shown in FIG. 5S). In a state in which the clamping of the substrate 2 by the clamping members 37 completes, the upper surface of the substrate 2 and the upper surfaces of the clamping members 37 are at the same height. The upper surface of the mask contact member 43 of each urging portion 40 and the upper surface of the substrate 2 (the upper surface of the clamping member 37) are also at the same height.

In this embodiment, the substrate holding unit 21 serves as a substrate holder that clamps and holds the substrate 2 at the sides of the substrate 2 by the pair of clamping members 37 below the mask 13.

When the clamping members 37 clamp the substrate 2, the substrate holding unit moving mechanism 22 pushes the substrate holding unit 21 upward (the arrow C1 shown in FIG. 5C). The upward pushing of the substrate holding unit 21 is stopped (FIG. 5C) as the base table 35a is positioned at the third position (a height of H3) and the substrate 2 is brought into contact with the mask 13. After the substrate 2 contacts with the mask 13, the substrate holding unit moving mechanism 22 further moves the substrate holding unit 21 up to slightly push the mask 13 upward, and then moves the substrate holding unit 21 down to position the base table 35a at a height of H3. Accordingly, the substrate 2 is securely brought into close contact with the mask 13.

In FIGS. 3 and 4, the printing head 16 is provided with two squeegees 52 opposed to each other in the Y-axis direction below a moving base 51 provided to extend in the X-axis direction. The printing head moving mechanism 16M has two printing head moving ball screws 16a which extend in the Y-axis direction and are screwed into right and left end portions of the moving base 51, and two printing head moving motors 16b which rotate and drive the two printing head moving ball screws 16a. When the two printing head moving ball screws 16a are rotated in synchronization with each other by the two printing head moving motors 16b, the moving base 51 is moved in the Y-axis direction. Each of the two squeegees 52 is separately moved up and down below the moving base 51 using a squeegee elevation cylinder 53 provided in the moving base 51.

In FIGS. 3 and 4, the camera unit 18 has an upper imaging camera 18a of which an imaging visual field is directed upward and a lower imaging camera 18b of which an imaging visual field is directed downward. The camera unit moving mechanism 18M is formed of an XY-table mechanism and a moving plate 18p to which the camera unit 18 is attached is moved in the horizontal plane.

The paste supply syringe 17 stores a paste Pst therein, and emits and supplies the paste to the lower side. In FIGS. 2 and 4, the paste supply syringe 17 is attached to a syringe base 51a which is freely moved in the X-axis direction along the moving base 51. The paste supply syringe 17 is moved in the Y-axis direction together with the squeegees 52 by the movement of the moving base 51 in the Y-axis direction, and is moved in the X-axis direction by the movement of the syringe base 51a in the X-axis direction. Therefore, the paste supply syringe 17 is freely moved in the X-Y plane, and thus the paste Pst can be supplied to an arbitrary region on the mask 13.

Figure 9:
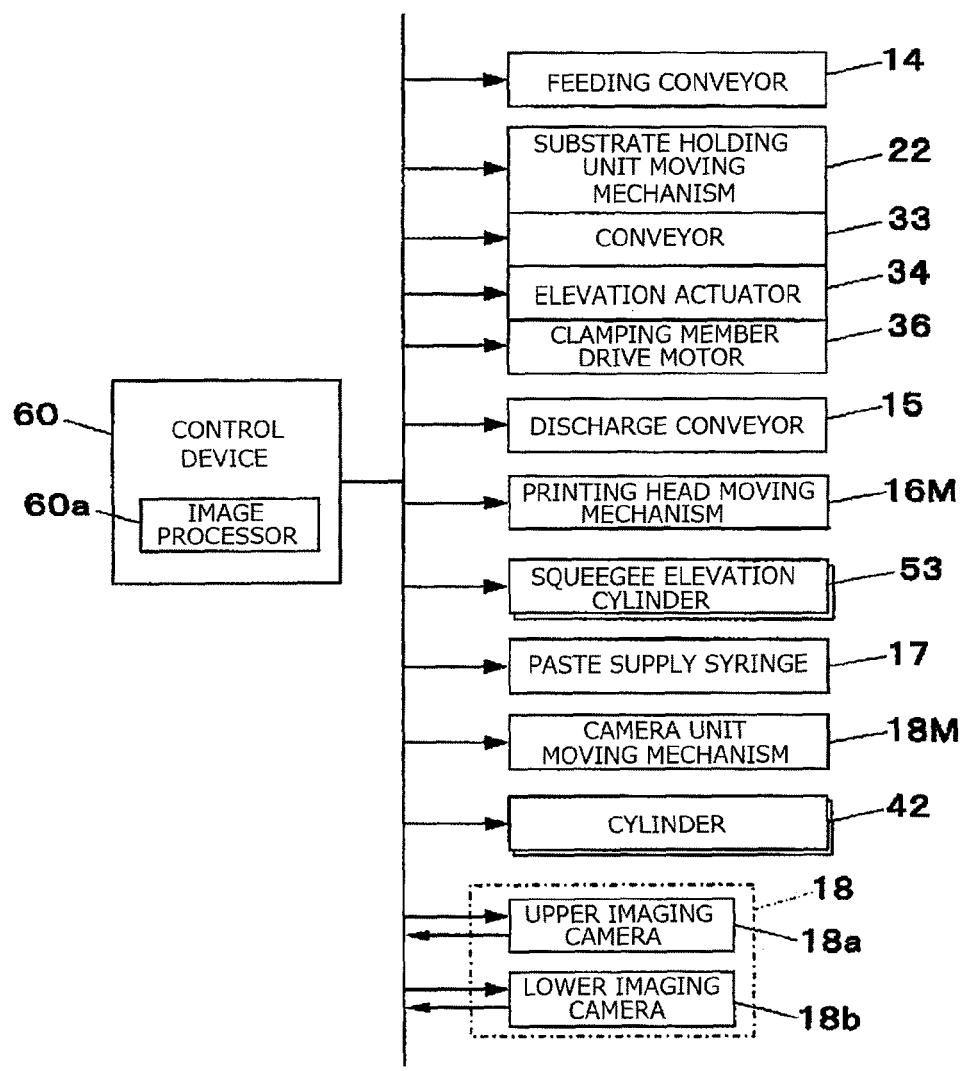
FIG. 9 is a block diagram showing a control system of the screen printer of the first embodiment of the invention.

In FIG. 9, a control device 60 of the screen printer 5 controls the operation of feeding the substrate 2 by the feeding conveyor 14, the operation of moving the substrate 2 to the clamping position by the conveyors 33, the operation of moving the lower receiving portion 35 up and down by the elevation actuator 34, the clamping operation of the clamping members 37 by the clamping member drive motor 36, the operations of moving the substrate holding unit 21 in the horizontal plane and of moving the substrate holding unit 21 up and down by the substrate holding unit moving mechanism 22, and the operation of discharging the substrate 2 by the discharge conveyor 15. The control device 60 also controls the operation of moving the printing head 16 in the Y-axis direction by the printing head moving mechanism 16M, the operation of moving each squeegee 52 up and down by the squeegee elevation cylinder 53, the operation of emitting the paste Pst by the paste supply syringe 17, the operation of moving the camera unit 18 in the horizontal plane by the camera unit moving mechanism 18M, and the operation of moving the mask contact member 43 up and down by the cylinders 42.

In FIG. 9, the upper imaging camera 18a images the mask-side marks 13m provided in the mask 13 under the control of the control device 60. The lower imaging camera 18b images the substrate-side marks 2m of the substrate 2 held by the substrate holding unit 21 under the control of the control device 60. Both image data obtained through the imaging of the upper imaging camera 18a and image data obtained through the imaging of the lower imaging camera 18b are input to the control device 60 and subjected to an image process in an image processor 60a of the control device 60. The control device 60 calculates a position of each mask-side mark 13m based on the obtained image of the mask-side mark 13m, and calculates a position of each substrate-side mark 2m based on the obtained image of the substrate-side mark 2m.

Figure 5B:
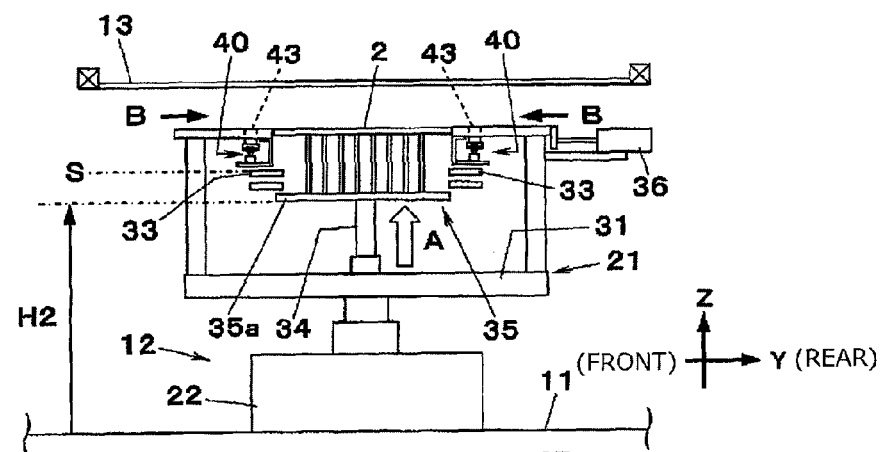
Figure 5C:
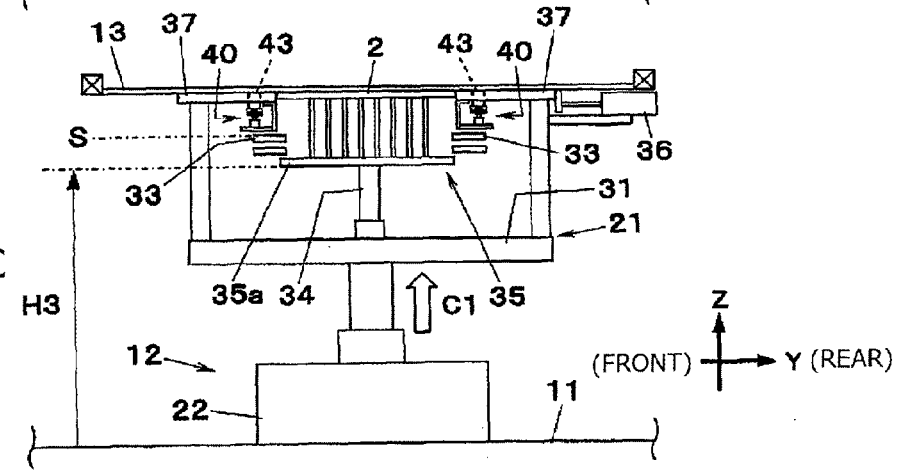
Figure 10A:
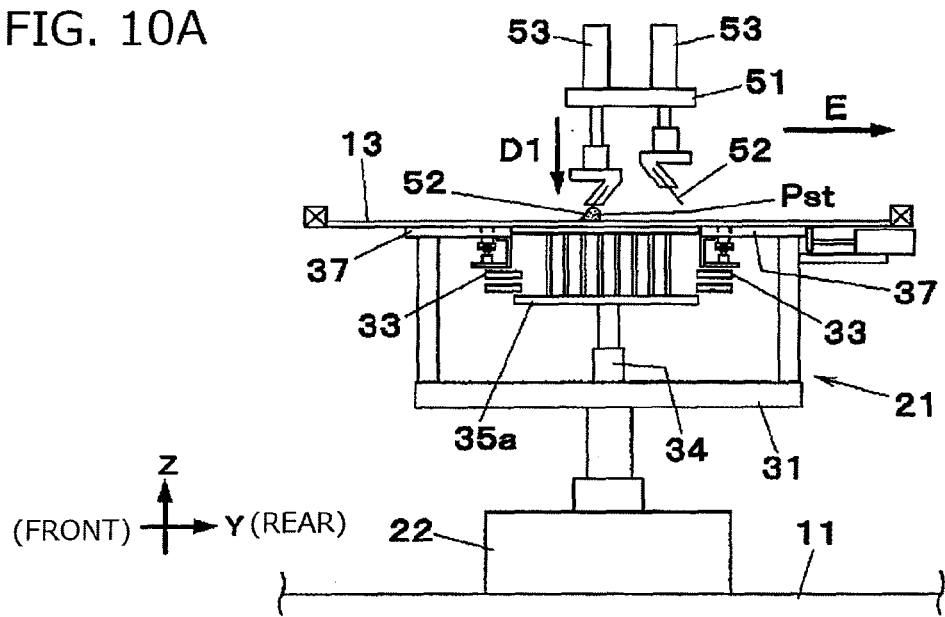
FIGS. 10A and 10B are diagrams illustrating operations of the screen printer of the first embodiment of the invention.

Next, procedures for execution of screen printing by the screen printer 5 will be described using FIGS. 5, 10, and 11. When detecting the sending of the substrate 2 from the substrate supply portion 4, the control device 60 receives the substrate 2 using the feeding conveyor 14 to position the substrate 2 at the clamping position (FIG. 5A), and operates the elevation actuator 34 to move the lower receiving portion 35 up so that the lower receiving portion 35 supports the substrate 2 from the lower side and the base table 35a is positioned at the first position. In addition, the control device 60 operates the clamping member drive motor 36 to clamp and hold the substrate 2 at the sides using the clamping members 37 (FIG. 5B; the arrow B shown in FIG. 5B; substrate holding process). After clamping the substrate 2 by the clamping members 37, the control device 60 moves the camera unit 18 by the camera unit moving mechanism 18M to image the mask-side marks 13m of the mask 13 by the upper imaging camera 18a in order to recognize the position of the mask 13, and to image the substrate-side marks 2m by the lower imaging camera 18b in order to recognize the position of the substrate 2.

After recognizing the positions of the mask-side marks 13m and the substrate-side marks 2m, the control device 60 matches the mask-side marks 13m and the substrate-side marks 2m based on the result of the recognition when viewed from above, and moves the substrate holding unit 21 up by the substrate holding unit moving mechanism 22 (the arrow C1 shown in FIG. 5C) to contact the substrate 2 held by the substrate holding unit 21 with the lower surface of the mask 13 (FIG. 5C; contact process). Accordingly, the electrodes 2a of the substrate 2 and the pattern holes 13P formed on the mask 13 are matched.

In this embodiment, the substrate holding unit moving mechanism 22 serves as a substrate holder elevation mechanism which moves the substrate holding unit 21, which serves as a substrate holder holding the substrate 2, up and down to contact the substrate 2 with the lower surface of the mask 13.

After contacting the substrate 2 with the mask 13, the control device 60 performs an examination to confirm whether the amount of the paste Pst remaining on the mask 13 is sufficient using a paste amount confirming device (not shown). When it is determined that the amount of the paste Pst remaining on the mask 13 is not sufficient, the paste supply syringe 17 supplies the paste Pst to the mask 13.

When determining that the amount of the paste Pst remaining on the mask 13 is sufficient as a result of the confirmation of the paste amount (when the paste supply syringe 17 supplies the paste Pst, the confirmation of the paste amount is performed thereafter), the control device 60 fills, with the paste Pst, the pattern holes 13P of the mask 13 contacted with the substrate 2 (paste filling process). Specifically, the control device 60 moves one squeegee 52 down using the squeegee elevation cylinder 53 (the arrow D1 shown in FIG. 10A) to contact the squeegee 52 with the mask 13, and then moves the moving base 51 (that is, printing head 16) in the Y-axis direction (the arrow E shown in FIG. 10A) to move (slide) the squeegee 52 on the mask 13. Through the squeezing, the paste Pst is scraped on the mask 13 and is filled in the pattern holes 13P of the mask 13.

In this embodiment, the squeegee 52 serves as a paste filling unit that fills the pattern holes 13P with the paste Pst on the mask 13 by sliding on the mask 13 which is in contact with the substrate 2 moved by the substrate holding unit moving mechanism 22 which serves as a substrate elevation mechanism.

Figure 10B:
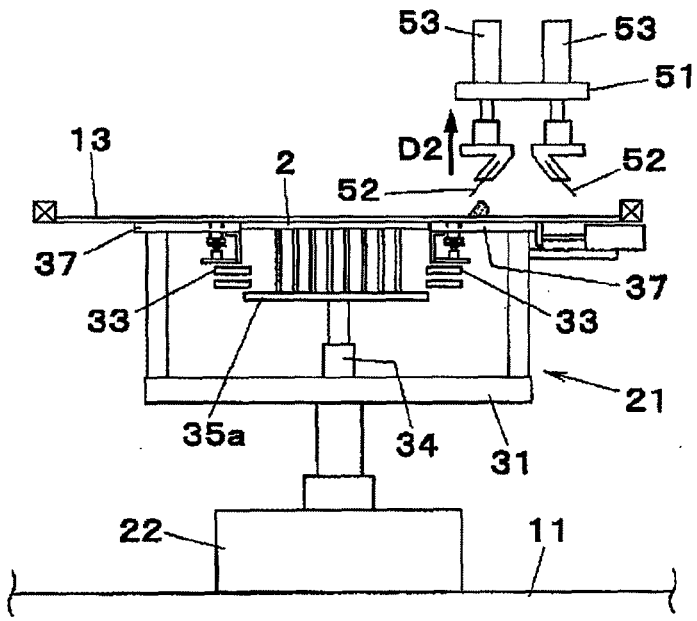
Figure 11A:
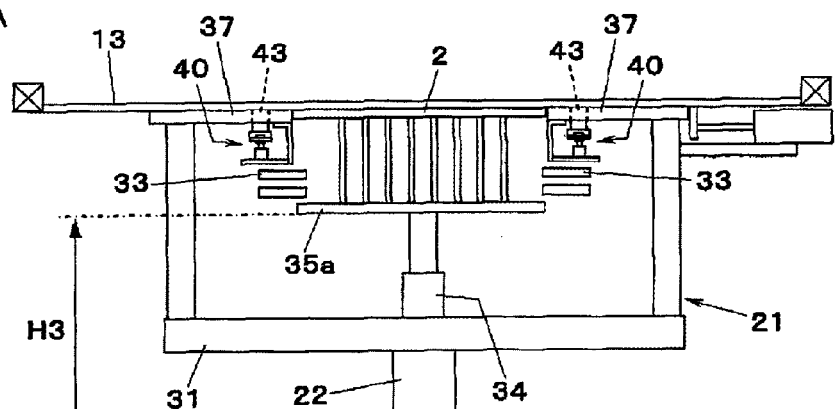
FIGS. 11A, 11B, and 11C are diagrams illustrating operations of the screen printer of the first embodiment of the invention.
Figure 11B:
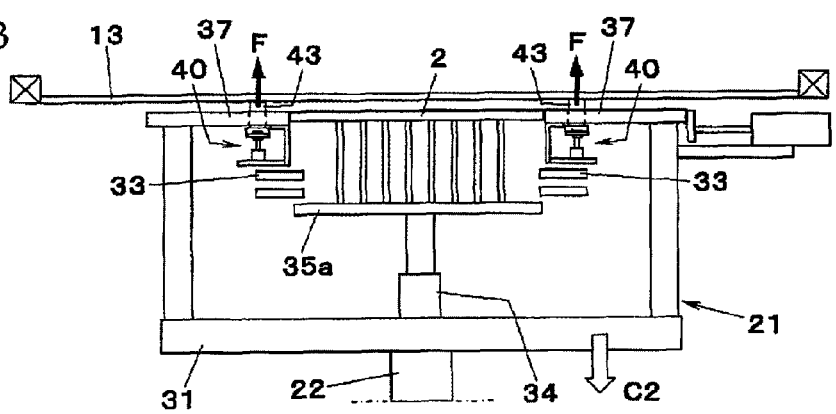
Figure 11C:
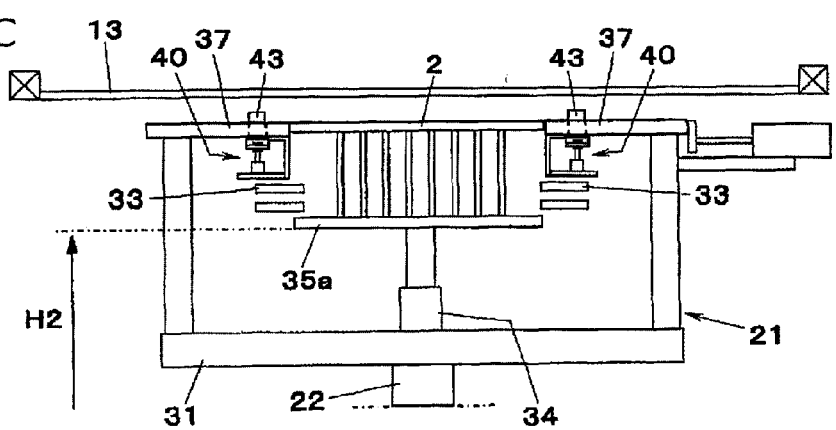

After moving the printing head 16 and filling the pattern holes 13P of the mask 13 with the paste Pst, the control device 60 operates the squeegee elevation cylinder 53 to move the squeegee 52 up (the arrow D2 shown in FIG. 10B). The control device 60 operates the substrate holding unit moving mechanism 22 to move the elevation plate 31 down (the arrow C2 shown in FIG. 11B) to thus move the substrate 2 in a direction away from the mask 13 (here, downward direction), thereby performing plate releasing (FIG. 11A to FIG. 11B to FIG. 11C; plate releasing process).

In the plate releasing, the control device 60 operates each cylinder 42 to allow the pair of mask contact members 43 to protrude upward from the clamping members 37. Accordingly, in the plate releasing, the mask 13 is relatively pushed upward with respect to the clamping members 37 (thus, with respect to the substrate 2) (the arrow F shown in FIG. 11B), and the mask 13 brought into close contact with the substrate 2 via the sticky paste Pst is prevented from being pulled toward the substrate 2 and from being bent downward. Accordingly, in the plate releasing, the mask 13 maintains the initial horizontal posture (FIGS. 11B and 11C) and plate separation is smoothly performed.

After the end of the screen printing per one substrate 2, the control device 60 releases the clamping of the substrate 2 by opening the clamping members 37, and then operates the elevation actuator 34 to move the lower receiving portion 35 down to thus place the substrate 2 on the conveyors 33. At this time, the lower receiving portion 35 is moved down until the base table 35a is positioned at the first position having a height of H1.

After placing the substrate 2 on the conveyors 33 as described above, the control device 60 operates the conveyors 33 and the discharge conveyor 15 in conjunction with each other to discharge the substrate 2 to another device (component mounting machine 6) on the downstream process side from the screen printer 5. After discharging the substrate 2, the control device 60 determines whether there is another substrate 2 to be subjected to the screen printing. As a result, when there is another substrate 2 to be subjected to the screen printing, the substrate 2 is fed using the feeding conveyor 14, and when there is no substrate 2 to be subjected to the screen printing, a series of operations ends.

In FIG. 1, the component mounting machine 6 is provided with a substrate transport lane 72 on a base 71, a plurality of part feeders 73 as a component supply portion, and two mounting heads 75 which are moved by a head moving mechanism 74 formed of an XY-robot. The substrate transport lane 72 receives and feeds the substrate 2 on which the paste Pst is printed by the screen printer 5 from the discharge conveyor 15 of the screen printer 5, and positions the substrate 2 at a predetermined position. Each of the two mounting heads 75 picks up a component 3 supplied from each part feeder 73 and mounts the component 3 on the substrate 2 positioned by the substrate transport lane 72. When the mounting of the component 3 on the substrate 2 ends, the substrate transport lane 72 is operated to discharge the substrate 2 to the outside (downstream process side).

In the first embodiment, in the screen printer 5, the clamping member 37 constituting the substrate holding unit 21 is provided with the urging portion 40 formed of the mask contact member 43 which contacts with the mask 13 in a state in which the substrate 2 contacts with the mask 13 and the urging unit (cylinders 42) that urges the mask contact member 43 upward, and this urging portion 40 urges the mask 13 upward in the plate releasing (pushes up the mask 13 with respect to the substrate 2). Accordingly, plate separation is smoothly performed without pulling and downward bending of the mask 13 toward the substrate 2 in the plate releasing, and thus good printing accuracy can be secured. In addition, since the urging portion 40 can be inexpensively made to have a simple configuration, there is an advantage in cost.

(Second Embodiment)

Next, a second embodiment of the invention will be described using FIGS. 12 to 14. The overall process of a component mounting line 1 of the second embodiment is the same as in the first embodiment, and a screen printer 5 of the second embodiment differs only in the configuration of an urging portion (the reference number 140).

Figure 12:
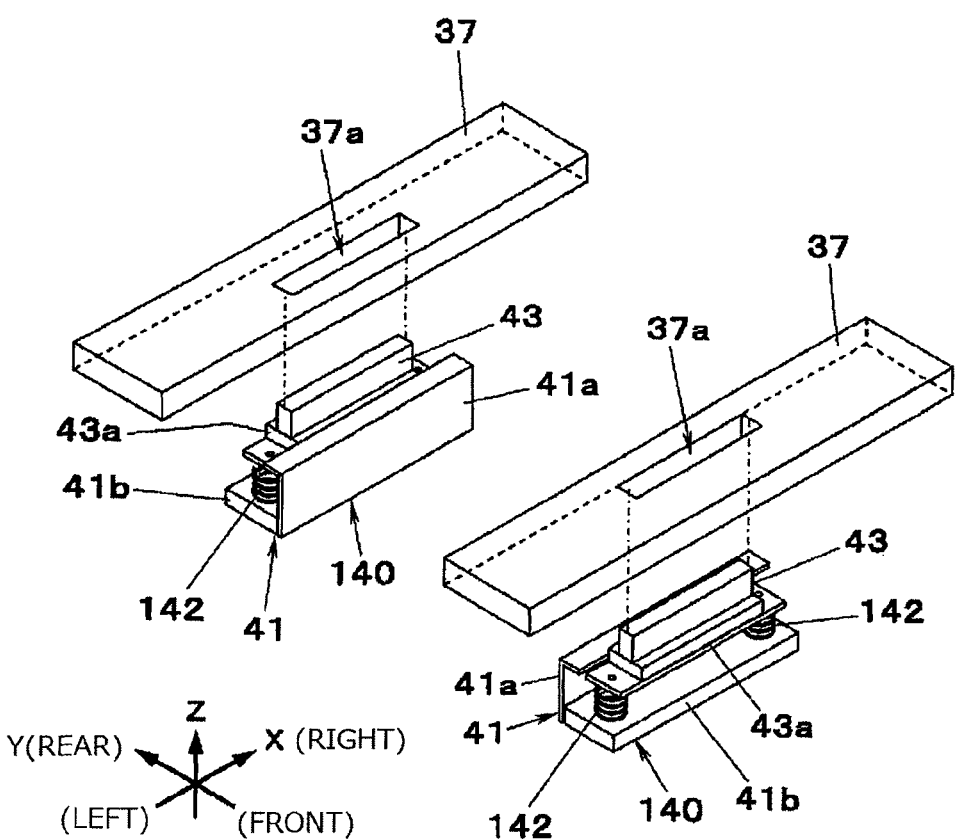
FIG. 12 is a partial exploded perspective view of a substrate holding unit of a screen printer of a second embodiment of the invention.

In FIG. 12, the urging portion 140 of the second embodiment is different from the urging portion 40 of the first embodiment, and means for urging a mask contact member 43 in such a direction that the mask contact member 43 is allowed to protrude upward from a clamping member 37 is an elastic body (here, a spring member is used, but a rubber member or the like may be used) 142. That is, in the second embodiment, the clamping member 37 is formed of the mask contact member 43 which contacts with a mask 13 in a state in which a substrate 2 contacts the mask 13 and the elastic body 142 as an urging unit that urges the mask contact member 43 upward.

Figure 13A:
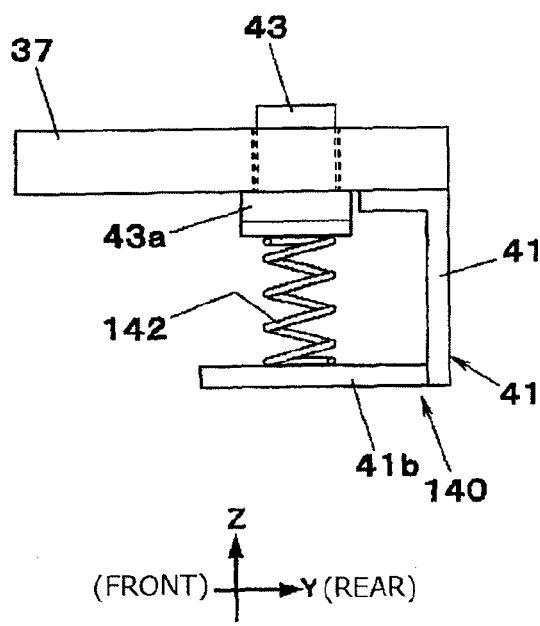
FIGS. 13A and 13B are side views of an urging portion of the substrate holding unit of the second embodiment of the invention.
Figure 13B:
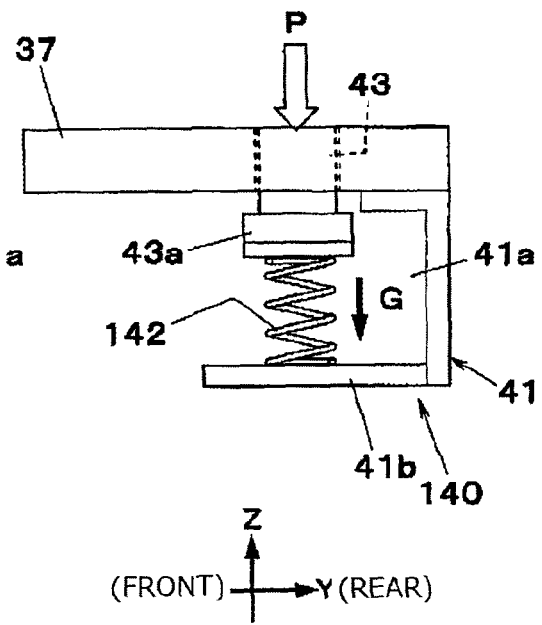
Figure 14A:
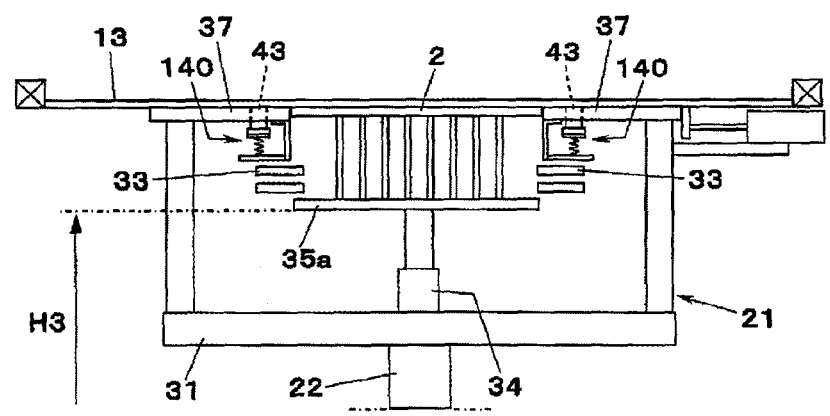
FIGS. 14A, 14B, and 14C are diagrams illustrating operations of the screen printer of the second embodiment of the invention.
Figure 14B:
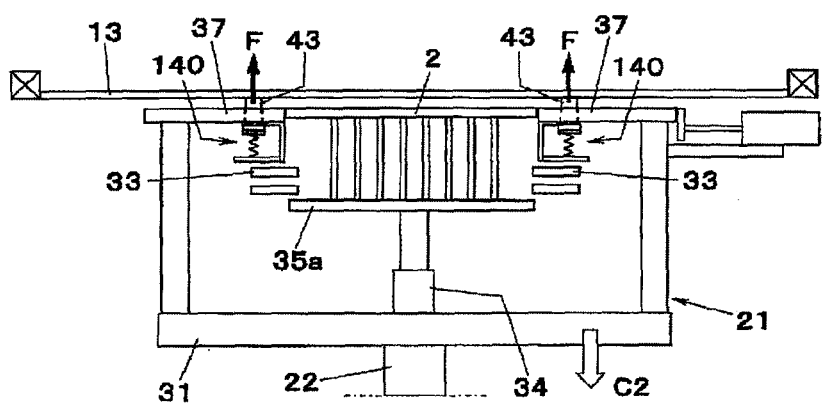
Figure 14C:
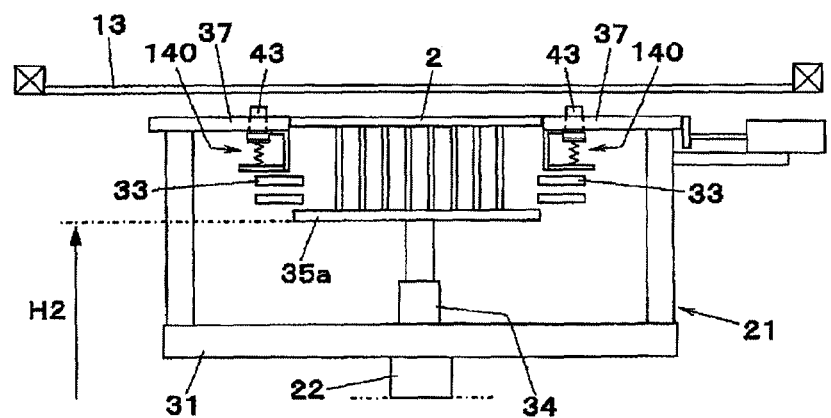

The mask contact member 43 is urged upward by the elastic body 142, and its upper end portion is allowed to protrude upward from the clamping member 37 at a position where a stopper 43a is brought into contact with a lower surface of the clamping member 37 (FIG. 13A). In this state, when a downward pressing force P acts on the mask contact member 43, the mask contact member 43 is moved down in a vertical through hole 37a of the clamping member 37 (the arrow G shown in FIG. 13B), and pushes and contracts the elastic body 142 (FIG. 13B).

In the screen printer 5 of the second embodiment, in a state in which the substrate 2 held by a substrate holding unit 21 is brought into contact with the mask 13 (FIG. 14A), the mask contact member 43 of each urging portion 140 is pressed downward y a pressing force (corresponding to the above-described pressing force P) received from the mask 13, and is thus positioned in the vertical through hole 37a of the clamping member 37 to push and contract the elastic body 142. In this state, the mask 13 is brought into close contact with the substrate 2 via a sticky paste Pst, and thus when a substrate holding unit moving mechanism 22 moves the substrate holding unit 21 down to start plate releasing, the mask 13 is pulled toward the substrate and bent downward. However, since the pressing force pushing and contracting the elastic body 142 of each urging portion 40 is gradually reduced, the elastic body 142 operates to return to the original shape, and the mask 13 is relatively pushed upward with respect to the clamping member 37 (that is, with respect to the substrate 2) by the mask contact member 43 protruding from the upper surface of the clamping member 37 (the arrow F shown in FIG. 14B). Therefore, the mask 13 is prevented from being pulled toward the substrate 2 and from being bent downward, and thus in the plate releasing, the mask 13 maintains the initial horizontal posture (FIGS. 14B and 14C) and plate separation is smoothly performed.

Also in the screen printer 5 of the second embodiment, the clamping member 37 constituting the substrate holding unit 21 is provided with the mask contact member 43 which contacts with the mask 13 in a state in which the substrate 2 contacts with the mask 13 and the urging portion 140 formed of the urging unit (elastic body 142) that urges the mask contact member 43 upward, and this urging portion 140 urges the mask 13 upward (pushes up the mask 13 with respect to the substrate 2) in the plate releasing. Accordingly, plate separation is smoothly performed without pulling and downward bending of the mask 13 toward the substrate 2, and thus it is possible to obtain the same effect as that of the first embodiment.

In the above-described embodiments, as the paste filling unit that fills the pattern holes 13P of the mask 13 with the paste Pst, a type of scraping the paste Pst on the mask 13 (squeegees 52) is shown. However, the paste filling unit is not limited to the type of scraping the paste Pst on the mask 13. A type of directly emitting and supplying the paste Pst accommodated therein to the pattern holes 13P of the mask 13 may be used.

A screen printer and a component mounting line which are capable of securing good printing accuracy by smoothly performing plate separation and are advantageous in cost are provided.

What is claimed is:

1. A screen printer comprising:
   a mask on which a pattern hole is formed;
   a substrate holder that clamps and holds a substrate at sides of the substrate by a pair of clamping members below the mask;
   a substrate holder elevation mechanism that moves the substrate holder holding the substrate up and down to contact the substrate with a lower surface of the mask;
   a paste filling unit that fills, with a paste, the pattern hole of the mask that is contacted with the substrate by the substrate holder elevation mechanism;
   a mask contact member that is provided in each of the clamping members and that contacts with the mask in a state in which the substrate contacts with the mask; and
   an urging portion that is provided in each of the clamping members and that includes an urging unit that urges each mask contact member upward,
   wherein, after the pattern hole of the mask is filled with the paste, the substrate holder elevation mechanism moves the substrate in a direction away from the mask to perform plate releasing with each urging portion urging each mask contact member upward.

2. The screen printer according to claim 1,
   wherein the urging unit includes a cylinder or an elastic body.

3. The screen printer according to claim 1,
   wherein each mask contact member is provided within the clamping member.

4. A component mounting line comprising:
   the screen printer according to claim 1; and
   a component mounting machine that mounts a component on the substrate on which the paste is printed by the screen printer.

5. A component mounting line comprising:
   the screen printer according to claim 2; and
   a component mounting machine that mounts a component on the substrate on which the paste is printed by the screen printer.

6. A component mounting line comprising:
   the screen printer according to claim 3; and
   a component mounting machine that mounts a component on the substrate on which the paste is printed by the screen printer.

* * * * *